(12) United States Patent
Krause et al.

(10) Patent No.: US 9,590,601 B2
(45) Date of Patent: Mar. 7, 2017

(54) ENERGY EFFICIENT CONTROLLED MAGNETIC FIELD GENERATOR CIRCUIT

(71) Applicant: Lockheed Martin Corporation, Bethesda, MD (US)

(72) Inventors: James Michael Krause, Saint Michael, MN (US); James P. Mabry, Reston, VA (US); Elton Pepa, Dumfries, VA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 34 days.

(21) Appl. No.: 14/680,877

(22) Filed: Apr. 7, 2015

(65) Prior Publication Data
US 2015/0288352 A1 Oct. 8, 2015

Related U.S. Application Data

(60) Provisional application No. 61/975,997, filed on Apr. 7, 2014.

(51) Int. Cl.
*H01H 47/00* (2006.01)
*H03K 4/06* (2006.01)
(Continued)

(52) U.S. Cl.
CPC ............... *H03K 4/06* (2013.01); *H02J 5/005* (2013.01); *H02J 7/025* (2013.01); *H02J 50/10* (2016.02); *H04B 5/0037* (2013.01); *Y02T 90/122* (2013.01)

(58) Field of Classification Search
USPC .................................. 307/104; 361/139, 144
See application file for complete search history.

(56) References Cited

U.S. PATENT DOCUMENTS 2,746,027 A 5/1956 Murray
3,389,333 A 6/1968 Wolff et al.
(Continued)

FOREIGN PATENT DOCUMENTS

DE 69608006 T2 2/2001
DE 19600241 C2 8/2002
(Continued)

OTHER PUBLICATIONS

"Diamond Sensors, Detectors, and Quantum Devices'in Patent Application Approval Process," Chemicals & Chemistry (Feb. 28, 2014).
(Continued)

*Primary Examiner* — Danny Nguyen
(74) *Attorney, Agent, or Firm* — Foley & Lardner LLP

(57) ABSTRACT

A magnetic waveform generator circuit includes a first switch coupled to a first rectifier element at a first node, a first capacitor coupled, at a second node to the first switch, and to a fourth node, a second capacitor coupled, at a third node to the first rectifier element, and to the fourth node, and an inductor coupled between the first and the fourth nodes. The first switch is operable to be in an ON state during a first time period and in an off state during a second time period. The first switch and the first rectifier element are configured to enable the inductor to generate, during the first and the second time periods, a magnetic field having a waveform resembling a positive half-cycle of a triangular waveform.

14 Claims, 7 Drawing Sheets

(51) Int. Cl.
*H02J 5/00* (2016.01)
*H04B 5/00* (2006.01)
*H02J 7/02* (2016.01)

(56) References Cited

U.S. PATENT DOCUMENTS

| | | | |
|---|---|---|---|
| 3,514,723 A | 5/1970 | Cutler | |
| 3,518,531 A | 6/1970 | Huggett | |
| 3,745,452 A | 7/1973 | Osburn et al. | |
| 3,899,758 A | 8/1975 | Maier et al. | |
| 4,078,247 A * | 3/1978 | Albrecht | H02M 7/525 363/136 |
| 4,084,215 A | 4/1978 | Willenbrock | |
| 4,329,173 A | 5/1982 | Culling | |
| 4,368,430 A | 1/1983 | Dale et al. | |
| 4,514,083 A | 4/1985 | Fukuoka | |
| 4,588,993 A | 5/1986 | Babij et al. | |
| 4,638,324 A | 1/1987 | Hannan | |
| 4,675,522 A | 6/1987 | Arunkumar | |
| 4,945,305 A | 7/1990 | Blood | |
| 5,019,721 A | 5/1991 | Martens et al. | |
| 5,038,103 A | 8/1991 | Scarzello et al. | |
| 5,113,136 A | 5/1992 | Hayashi et al. | |
| 5,134,369 A | 7/1992 | Lo et al. | |
| 5,189,368 A | 2/1993 | Chase | |
| 5,245,347 A | 9/1993 | Bonta et al. | |
| 5,252,912 A | 10/1993 | Merritt et al. | |
| 5,301,096 A | 4/1994 | Klontz et al. | |
| 5,384,109 A | 1/1995 | Klaveness et al. | |
| 5,396,802 A | 3/1995 | Moss | |
| 5,568,516 A | 10/1996 | Strohallen et al. | |
| 5,694,375 A | 12/1997 | Woodall | |
| 5,818,352 A | 10/1998 | McClure | |
| 5,907,420 A | 5/1999 | Chraplyvy et al. | |
| 6,057,684 A | 5/2000 | Murakami et al. | |
| 6,124,862 A | 9/2000 | Boyken et al. | |
| 6,130,753 A | 10/2000 | Hopkins et al. | |
| 6,195,231 B1 | 2/2001 | Sedlmayr et al. | |
| 6,360,173 B1 | 3/2002 | Fullerton | |
| 6,398,155 B1 | 6/2002 | Hepner et al. | |
| 6,433,944 B1 | 8/2002 | Nagao et al. | |
| 6,504,365 B2 | 1/2003 | Kitamura | |
| 6,542,242 B1 | 4/2003 | Yost et al. | |
| 6,636,146 B1 | 10/2003 | Wehoski | |
| 6,686,696 B2 | 2/2004 | Mearini et al. | |
| 6,690,162 B1 | 2/2004 | Schopohl et al. | |
| 7,118,657 B2 | 10/2006 | Golovchenko et al. | |
| 7,221,164 B1 | 5/2007 | Barringer | |
| 7,277,161 B2 | 10/2007 | Claus | |
| 7,305,869 B1 | 12/2007 | Berman et al. | |
| 7,307,416 B2 | 12/2007 | Islam et al. | |
| RE40,343 E | 5/2008 | Anderson | |
| 7,413,011 B1 | 8/2008 | Chee et al. | |
| 7,427,525 B2 | 9/2008 | Santori et al. | |
| 7,448,548 B1 | 11/2008 | Compton | |
| 7,471,805 B2 | 12/2008 | Goldberg | |
| 7,474,090 B2 | 1/2009 | Islam et al. | |
| 7,543,780 B1 | 6/2009 | Marshall et al. | |
| 7,546,000 B2 | 6/2009 | Spillane et al. | |
| 7,983,812 B2 | 7/2011 | Potter | |
| 8,120,351 B2 | 2/2012 | Rettig et al. | |
| 8,120,355 B1 | 2/2012 | Stetson | |
| 8,138,756 B2 | 3/2012 | Barclay et al. | |
| 8,294,306 B2 | 10/2012 | Kumar et al. | |
| 8,311,767 B1 | 11/2012 | Stetson | |
| 8,334,690 B2 | 12/2012 | Kitching et al. | |
| 8,415,640 B2 | 4/2013 | Babinec et al. | |
| 8,471,137 B2 | 6/2013 | Adair et al. | |
| 8,480,653 B2 | 7/2013 | Birchard et al. | |
| 8,525,516 B2 | 9/2013 | Le Prado et al. | |
| 8,547,090 B2 | 10/2013 | Lukin et al. | |
| 8,574,536 B2 | 11/2013 | Boudou et al. | |
| 8,575,929 B1 | 11/2013 | Wiegert | |
| 8,686,377 B2 | 4/2014 | Twitchen et al. | |
| 8,758,509 B2 | 6/2014 | Twitchen et al. | |
| 8,803,513 B2 | 8/2014 | Hosek et al. | |
| 8,885,301 B1 | 11/2014 | Heidmann | |
| 8,913,900 B2 | 12/2014 | Lukin et al. | |
| 8,947,080 B2 | 2/2015 | Lukin et al. | |
| 9,157,859 B2 | 10/2015 | Walsworth et al. | |
| 9,249,526 B2 | 2/2016 | Twitchen et al. | |
| 2002/0167306 A1 | 11/2002 | Zalunardo et al. | |
| 2003/0058346 A1 | 3/2003 | Bechtel et al. | |
| 2003/0076229 A1 | 4/2003 | Blanpain et al. | |
| 2003/0235136 A1 | 12/2003 | Akselrod et al. | |
| 2004/0013180 A1 | 1/2004 | Giannakis et al. | |
| 2004/0022179 A1 | 2/2004 | Giannakis et al. | |
| 2004/0042150 A1 | 3/2004 | Swinbanks et al. | |
| 2004/0109328 A1 | 6/2004 | Dahl et al. | |
| 2004/0247145 A1 | 12/2004 | Luo et al. | |
| 2005/0099177 A1 | 5/2005 | Greelish | |
| 2005/0126905 A1 | 6/2005 | Golovchenko et al. | |
| 2005/0130601 A1 | 6/2005 | Palermo et al. | |
| 2005/0134257 A1 | 6/2005 | Etherington et al. | |
| 2005/0146327 A1 | 7/2005 | Jakab | |
| 2006/0054789 A1 | 3/2006 | Miyamoto et al. | |
| 2006/0062084 A1 | 3/2006 | Drew | |
| 2006/0071709 A1 | 4/2006 | Maloberti et al. | |
| 2007/0004371 A1 | 1/2007 | Okanobu | |
| 2007/0247147 A1 | 10/2007 | Xiang et al. | |
| 2008/0016677 A1 | 1/2008 | Creighton, IV | |
| 2008/0048640 A1 | 2/2008 | Hull et al. | |
| 2008/0078233 A1 | 4/2008 | Larson et al. | |
| 2008/0089367 A1 | 4/2008 | Srinivasan et al. | |
| 2008/0204004 A1 | 8/2008 | Anderson | |
| 2008/0217516 A1 | 9/2008 | Suzuki et al. | |
| 2008/0239265 A1 | 10/2008 | Den Boef | |
| 2008/0299904 A1 | 12/2008 | Yi et al. | |
| 2009/0042592 A1 | 2/2009 | Cho et al. | |
| 2009/0060790 A1 | 3/2009 | Okaguchi et al. | |
| 2009/0079426 A1 | 3/2009 | Anderson | |
| 2009/0132100 A1 | 5/2009 | Shibata | |
| 2009/0277702 A1 | 11/2009 | Kanada et al. | |
| 2009/0310650 A1 | 12/2009 | Chester et al. | |
| 2010/0045269 A1 | 2/2010 | Lafranchise et al. | |
| 2010/0134922 A1 | 6/2010 | Yamada et al. | |
| 2010/0157305 A1 | 6/2010 | Henderson | |
| 2010/0188081 A1 | 7/2010 | Lammegger | |
| 2010/0237149 A1 | 9/2010 | Olmstead | |
| 2010/0271016 A1 | 10/2010 | Barclay et al. | |
| 2010/0308813 A1 | 12/2010 | Lukin et al. | |
| 2010/0315079 A1 | 12/2010 | Lukin et al. | |
| 2010/0326042 A1 | 12/2010 | McLean et al. | |
| 2011/0034393 A1 | 2/2011 | Justen et al. | |
| 2011/0062957 A1 | 3/2011 | Fu et al. | |
| 2011/0063957 A1 | 3/2011 | Isshiki et al. | |
| 2011/0066379 A1 | 3/2011 | Mes | |
| 2011/0127999 A1 | 6/2011 | Lott et al. | |
| 2011/0165862 A1 | 7/2011 | Yu et al. | |
| 2011/0243267 A1 | 10/2011 | Won et al. | |
| 2012/0016538 A1 | 1/2012 | Waite et al. | |
| 2012/0019242 A1 | 1/2012 | Hollenberg et al. | |
| 2012/0037803 A1 | 2/2012 | Strickland | |
| 2012/0044014 A1 | 2/2012 | Stratakos et al. | |
| 2012/0051996 A1 | 3/2012 | Scarsbrook et al. | |
| 2012/0063505 A1 | 3/2012 | Okamura et al. | |
| 2012/0087449 A1 | 4/2012 | Ling et al. | |
| 2012/0140219 A1 | 6/2012 | Cleary | |
| 2012/0181020 A1 | 7/2012 | Barron et al. | |
| 2012/0194068 A1 | 8/2012 | Cheng et al. | |
| 2012/0257683 A1 | 10/2012 | Schwager et al. | |
| 2012/0281843 A1 | 11/2012 | Christensen et al. | |
| 2012/0326793 A1 | 12/2012 | Gan | |
| 2013/0127518 A1 | 5/2013 | Nakao | |
| 2013/0215712 A1 | 8/2013 | Geiser et al. | |
| 2013/0265782 A1 | 10/2013 | Barrena et al. | |
| 2014/0012505 A1 | 1/2014 | Smith et al. | |
| 2014/0037932 A1 | 2/2014 | Twitchen et al. | |
| 2014/0061510 A1 | 3/2014 | Twitchen et al. | |
| 2014/0072008 A1 | 3/2014 | Faraon et al. | |
| 2014/0077231 A1 | 3/2014 | Twitchen et al. | |
| 2014/0081592 A1 | 3/2014 | Bellusci et al. | |
| 2014/0104008 A1 | 4/2014 | Gan | |
| 2014/0126334 A1 | 5/2014 | Megdal et al. | |

(56) References Cited

U.S. PATENT DOCUMENTS

| | | |
|---|---|---|
| 2014/0139322 A1 | 5/2014 | Wang et al. |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0215985 A1 | 8/2014 | Pollklas |
| 2014/0247094 A1 | 9/2014 | Englund et al. |
| 2014/0272119 A1 | 9/2014 | Kushalappa et al. |
| 2014/0273826 A1 | 9/2014 | Want et al. |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0018018 A1 | 1/2015 | Shen et al. |
| 2015/0048822 A1 | 2/2015 | Walsworth et al. |
| 2015/0054355 A1* | 2/2015 | Ben-Shalom ........ H04B 5/0037 307/104 |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0299894 A1 | 10/2015 | Markham et al. |
| 2015/0374250 A1 | 12/2015 | Hatano et al. |

FOREIGN PATENT DOCUMENTS

| | | |
|---|---|---|
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 | 2/2015 |
| EP | 2 907 792 | 8/2015 |
| GB | 2 433 737 | 7/2007 |
| GB | 2 482 596 | 2/2012 |
| GB | 2 483 767 | 3/2012 |
| GB | 2 486 794 | 6/2012 |
| GB | 2 486 794 | 9/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011-153339 | 12/2011 |
| WO | WO-2012/016977 A2 | 2/2012 |
| WO | WO-2012/084750 | 6/2012 |
| WO | WO-2013/066446 A1 | 5/2013 |
| WO | WO-2013/066448 A2 | 5/2013 |
| WO | WO-2013/093136 A1 | 6/2013 |
| WO | WO-2013/188732 A1 | 12/2013 |
| WO | WO-2014/099110 A2 | 6/2014 |
| WO | WO-2014/135544 A1 | 9/2014 |
| WO | WO-2014/135547 A1 | 9/2014 |
| WO | WO-2014/165883 A1 | 10/2014 |
| WO | WO-2014/210486 A1 | 12/2014 |
| WO | WO-2015/015172 A1 | 2/2015 |
| WO | WO-2015/158383 A1 | 10/2015 |
| WO | WO-2015/193156 A1 | 12/2015 |

OTHER PUBLICATIONS

Acosta, et al., "Diamonds with a high density of nitrogen—vacancy centers for magnetometry applications," Physical Review B, Sep. 2009.

Albrecht , et al., "Coupling of nitrogen vacancy centres in nanodiamonds by means of phonoms," New Journal of Physics, Aug. 2013.

Anthony, et al., "Jahn-Teller Splitting and Zeeman Effect of Acceptors in Diamonds," 20th International Conference on Defects in Semiconductors, Jul. 1999.

Appel. et al., "Nanoscale microwave imaging with a single electron spin in diamond," New Journal of Physics, Nov. 2015.

Arai, et al., "Fourier magnetic imaging with nanoscale resolution and compressed sensing speed-up using electronics spins in diamond," Nature Nanotechnology, Oct. 2015.

Babamoradi, et al., "Correlation between entanglement and spin density in nitrogen-vacancy center of diamond, " European Physical Journal D, Dec. 2011.

Berman, et al., "Measurement of single electron and nuclear spin stated based on optically detected magnetic resonance," J. Physics: Conf. Series 38: 167-170 (2006).

Blakley, et al., "Room-temperature magnetic gradiometry with fiber-coupled nitrogen-vacancy centers in diamonds," Optics Letters, Aug. 2015.

Bourgeois, et al., "Photoelectric detection of electron spin resonance of nitrogen-vacancy centres in diamonds," Nature Communications, Oct. 2015.

Castelleto, et al., "Frontiers in diffraction unlimited optical methods for spin manipulation, magnetic field sensing and imaging using diamond nitrogen vacancy defects," Nanophotonics, 2012.

Chernobrod, et al., "Improving the sensitivity of frequencey modulation spectroscopy using nanomechanical cantilevers," Applied Physics Letters, 2004.

Chernobrod, et al., "Spin Microscope Based on Optically Detected Magnetic Resonance," Journal of Applied Physics, 2005.

Chipaux, et al., "Wide bandwidth instantaneous radio frequency spectrum analyzer based on nitrogen vacancy centers in diamonds," Applied Physics Letters, Dec. 2015.

Cooper, et al., "Time-resolved magnetic sensing with electronic soins in diamond," Nature Communications, Jan. 2014.

(56) References Cited

OTHER PUBLICATIONS

Degen, "Scanning magnetic field microscope with a diamond single-spin sensor," Applied Physics Letters, 2008.
Dentale, et al., "Fabrication and characterization of diamond moth eye antireflective surface on Ge," J. of Applied Physics, 1982.
Dumeige, et al., "Magnetometry with nitrogen-vacancies ensembles in diamond based on infrared absorption in a doubly resonant optical cavity," Physical Review B, Apr. 2013.
Fedotov, et al., "High-resolution magnetic field imaging with a nitrogen-vacancy diamond sensor intergrated with a photonic-crystal fiber," Optics Letters, Feb. 2016.
Gombert & Blasi, "The Moth-Eye Effect—From Fundamentals to Commercial Exploitation," Functional Properties of Bio-Inspired Surfaces, Nov. 2009.
Gould, et al., "Room-temperature detection of a single 19 nm super-paramagnetic nanoparticle with an imagingmagnetometer," Applied Physics Letters, Aug. 2014.
Haihua, et al., "Design of wideband anti-reflective sub wavelength nanostructure," Infrared and Laser Engineering, 2011.
Hall, et al., "Sensing of Fluctuating Nanoscale Magnetic Fields Using Nitrogen—Vacancy Centers in Diamond," Physical Review Letters, Nov. 2009.
Hanson, et al., "Coherent Dynamics of a single spin interacting with an adjustable spin bath," Sci, Am. Ass'n for the Advancement of Science, 2008.
Hobbs, "Study of the Enviromental and Optical Durability of AR Microstructures in Sapphire, ALON, and Diamond," Proceedings of SPIE, 2009.
Huebener, et al., "ODMR of NV centers in nano-diamonds covered with N@C60," Physica Status Solidi B, Oct. 2008.
Kim et al., "Electron spin resonance shift and linewidth broadening of nitrogen-vacancy centers in diamond as a function of electron irradiation dose." Appiied Physics Letters, Aug. 2012.
Kim, et al., "Zeeman effect of electronic Raman lines of acceptors in elemental semiconductors: Boron in blue diamond," Physical Review B, Sep. 2000.
Laraoui, et al., "Nitrogen-vacancy-assisted magnetometry of paramagnetic centers in an individual diamond nanocrystal," Nano Letters, Jul. 2012.
Meijer, et al., "Generation of single color centers by focused nitrogen implantation." Applied Physics Letters, Dec. 2005.
Moriyama, et al., "Importance of electron—electron interactions and Zeeman splitting in single-wall carbon nanotube quantum dots," Physica E, Feb. 2005.
Nagl, et al., "Improving surface and defect center chemistry of fluorescent nanodiamonds for imaging purpose—a review," Analytical and Bioanalaytical Chemistry, Oct. 2015.
Nizovtsev & Kiln, "Optically Detected Magnetic Resonance Spectra of the 14NV-13C Spin System in Diamond: Analytical Theory and Experiment," Doklady of the National Academy of Sciences of Belarus, 2013.
Nowodzinski, et al. "Nitrogen-Vacancy centers in diamond for current imaging at the redistributive layer level of Integrated Circuits," Microelectronics Reliability, Aug. 2015.
Plakhotnik, et al., "Super-Paramagnetic Particles Chemically Bound to Luminescent Diamond : Single Nanocrystal Probed with Optically Detected Magnetic Resonance," Journal of Physical Chemistry C, Aug. 2015.
Simanovaskaia, et al., "Sidebands in optically detected magnetic resonance signals of nitrogen vacancy centers in diamond," Physical Review B, Jun. 2013.
Steinert et al., "High-sensitivity magnetic imaging using an array of spins in diamond," Review of Scientific Instruments, Apr. 2010.
Taylor, et al., "High sensitivity diamond magnetometer with nanoscale resolution," Nature Physics. Oct. 2008.
Tetienne, et al., "Magnetic-field dependent photodynamics of single NV defects in diamond: an application to qualitative all-optical magnetic imaging," New Journal of Physics, Oct. 2012.
Uhlen, et al., "New Diamond Nanofabrication process for hard x-ray zone plates," J. of Vacuum Sciences & Tech. B, 2011.
Wolfe, et al., "Off-resonant manipulation of spins in diamond via processing magnetization of a proximal ferromagnet," Physical Review B, May 2014.
Zhao, et al. "Atomic-scale magnetometry of distant nuclear spin clusters via nitrogen-vacancy spin in diamond," Nature Nanotechnology, Apr. 2011.
Fallah et al., "Multi-sensor approach in vessel magnetic wake imaging," Wave Motion 51(1): 60-76 (Jan. 2014). retrieved from http://www.sciencedirect.com/science/article/pii/S0165212513001133 (Aug. 21, 2016), 17 pages.
International Preliminary Report on Patentability dated Oct. 20, 2016 from related PCT application PCT/US2015/024723, 7 pages.
International Search and Report Written Opinion of the International Searching Authority dated Sep. 13, 2016 from related PCT application No. PCT/US16/14377, 11 pages.
Notice of Allowance dated Aug. 17, 2016, from related U.S. Appl. No. 15/003,718, 8 pages.
Notice of Allowance dated Sep. 8, 2016, from related U.S. Appl. No. 15/003,298, 10 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
US Office Action dated Aug. 24, 2016 from related U.S. Appl. No. 14/676,740, 19 pages.
US Office Action dated Oct. 14, 2016 from related U.S. Appl. No. 15/003,677, 13 pages.
US Office Action dated Oct. 19, 2016 from related U.S. Appl. No. 15/218,821, 6 pages.
US Office Action dated Nov. 2, 2016 from related U.S. Appl. No. 15/003,256, 19 pages.
US Office Action dated Nov. 3, 2016 from related U.S. Appl. No. 15/204,675, 9 pages.
Widman et al., "Coherent control of single spins in silicon carbide at room temperature," Nature Materials, 14: 164-168 (Feb. 2015) (available online Dec. 1, 2014), 5 pages.
Acosta et al., "Broadband magnetometry by infrared-absorption detection of nitrogen-vacancy ensembles in diamond," Appl. Phys. Letters 97: 174104 (Oct. 29, 2010). 4 pages.
Barry, et al. "Optical magnetic detection of single-neuron action potentials using quantum defects in diamond," as submitted to Quantum Physics on Feb. 2, 2016, 23 pages.
Constable, "Geomagnetic Spectrum, Temporal," In Encyclopedia of Geomagnetism and Paleomagnetism, pp. 353-355, Springer: Dordrecht, Netherlands (2007).
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Jul. 6, 2015 from related PCT application PCT/US2015/021093, 9 pages.
International Search Report and Written Opinion of the International Searching Authority dated Jul. 8, 2015 from related PCT application PCT/US2015/024265, 11 pages.
International Search Report and Written Opinion of the International Searching Authority dated Jul. 12, 2016 from related PCT application PCT/US2016/014287, 14 pages.
International Search Report and Written Opinion of the International Searching Authority dated Jul. 16, 2015 from related PCT application PCT/US2015/24723, 8 pages.

(56) References Cited

OTHER PUBLICATIONS

International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016 from related PCT application PCT/US2016/014386, 14 pages.
International Search Report and Written Opinion of the International Searching Authority dated Jun. 2, 2016 from related PCT application PCT/US2016/014387, 13 pages.
International Search Report and Written Opinion of the International Searching Authority dated Jun. 6, 2016 from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014326, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016 from related PCT application PCT/US2016/014363, 8 pages.
International Search Report and Written Opinion of the International Searching Authority dated Mar. 25, 2016 from related PCT application PCT/US2016/014389, 19 pages.
International Search Report and Written Opinion of the International Searching Authority dated Mar. 28, 2016 from related PCT application PCT/US2016/014380, 9 pages.
International Search Report and Written Opinion of the International Searching Authority dated Mar. 28, 2016 from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016 from related PCT application PCT/US2016/014328, 7 pages.
International Search Report and Written Opinion of the International Searching Authority dated Mar. 29, 2016 from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev, B 85: 121202(R), pp. 121202-1-121202-4, (Mar. 23, 2012).
MacQuarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051 , pp. 1-12, (Dec. 2014).
Polatomic, "AN/ASQ-233A Digital Magnetic Anomaly Detecting Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Shao et al., "Diamond Color Center Based FM Microwave Demodulator," in Conference on Lasers and Electro-Optics, OSA Technical Digest (online) (Optical Society of America), paper JTh2A.136, 2 pages. (Jun. 5-10, 2016).
US Notice of Allowance dated Apr. 20, 2016, from related U.S. Appl. No. 15/003,718, 9 pages.
US Notice of Allowance dated Mar. 29, 2016, from related U.S. Appl. No. 15/003,590, 11 pages.
US Office Action dated Jul. 29, 2016 from related U.S. Appl. No. 14/680,877, 8 pages.
US Office Action dated May 13, 2016 from related U.S. Appl. No. 14/676,740, 15 pages.
US Office Action dated May 6, 2016 from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
"'Diamond Sensors, Detectors, and Quantum Devices' in Patent Application Approval Process," Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (U.S. Pat. No. 9,249,526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Acosta, "Optical Magnetometry with Nitrogen-Vacancy Centers in Diamond," University of California Berkeley, 2011.
Acosta, et al., "Diamonds with a high density of nitrogen-vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.

(56) References Cited

OTHER PUBLICATIONS

Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptor states in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Baranov, et al., "Enormously High Concentrations of Fluorescent Nitrogen-Vacancy Centers Fabricated by Sintering of Detonation Nanodiamonds," Small, Jun. 2011.
Barfuss, et al., "Strong mechanical driving of a single electron spin," Nature Physics, Oct. 2015.
Bennett, et al., "CVD Diamond for High Power Laser Applications," Proceedings of SPIE, Jan. 2013.
Berman & Chernobrod, "Single-spin microscope with sub-nanoscale resolution based on optically detected magnetic resonance," Proceedings of SPIE, May 2010.
Berman, et al. "Measurement of single electron and nuclear spin states based on optically detected magnetic resonance," J. Physics: Conf. Series 38: 167-170 (2006).
Blakley, et al., "Room-temperature magnetic gradiometry with fiber-coupled nitrogen-vacancy centers in diamond," Optics Letters, Aug. 2015.
Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.
Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.
Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resonance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.
Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., " Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.

Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen, "Scanning magnetic field microscope with a diamond single-spin sensor ," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.
Doherty, et al., "Theory of the ground-state spin of the NV-center in diamond," Physical Review B, May 2012.
Doi, et al., "Pure negatively charged state of the NV center in n-type diamond," Physical Review B, Feb. 2016.
Drake, et al., "Influence of magnetic field alignment and defect concentration on nitrogen-vacancy polarization in diamond," New Journal of Physics, Jan. 2016.
Dreau, et al., "Avoiding power broadening in optically detected magnetic resonance of single NV defects for enhanced dc magnetic field sensitivity," Physical Review B, Nov. 2011.
Dreau, et al., "High-resolution spectroscopy of single Nv defects coupled with nearby C-13 nuclear spins in diamond," Physical Review B, Apr. 2012.
Dumeige, et al., "Magnetometry with nitrogen-vacancy ensembles in diamond based on infrared absorption in a doubly resonant optical cavity," Physical Review B, Apr. 2013.
Epstein, et al., "Anisotropic interactions of a single spin and dark-spin spectroscopy in diamond," Center for Spintronics and Quantum Computation, 2005.
Fedotov, et al., "High-resolution magnetic field imaging with a nitrogen-vacancy diamond sensor integrated with a photonic-crystal fiber," Optics Letters, Feb. 2016.
Fedotov, et al., "Photonic-crystal-fiber-coupled photoluminescence interrogation of nitrogen vacancies in diamond nanoparticles," Laser Physics Letters, Feb. 2012.
Feng & Wei, "A steady-state spectral method to fit microwave absorptions of NV centers in diamonds: application to sensitive magnetic field sensing," Measurement Science & Technology, Oct. 2014.
Freitas, et al., "Solid-State Nuclear Magnetic Resonance (NMR) Methods Applied to the Study of Carbon Materials," Chemistry and Physics of Carbon, vol. 31, 2012.
Geiselmann, et al., "Fast optical modulation of the fluorescence from a single nitrogen-vacancy centre," Nature Physics, Dec. 2013.
Gombert & Blasi, "The Moth-Eye Effect-From Fundamentals to Commercial Exploitation," Functional Properties of Bio-Inspired Surfaces, Nov. 2009.
Gong, et al., "Generation of Nitrogen-Vacancy Center Pairs in Bulk Diamond by Molecular Nitrogen Implantation," Chinese Physics Letters, Feb. 2016.
Gould, et al., "An imaging magnetometer for bio-sensing based on nitrogen-vacancy centers in diamond," Proceedings of the SPIE—Progress in Biomedical Optics and Imaging, 2014.
Gould, et al., "Room-temperature detection of a single 19 nm super-paramagnetic nanoparticle with an imaging magnetometer," Applied Physics Letters, Aug. 2014.
Gruber, et al., "Scanning confocal optical microscopy and magnetic resonance on single defect centers," Science, Jun. 1997.
Haeberle, et al., "Nanoscale nuclear magnetic imaging with chemical contrast," Nature Nanotechnology, Feb. 2015.
Haihua, et al., "Design of wideband anti-reflective sub wavelength nanostructures," Infrared and Laser Engineering, 2011.
Hall, et al., "Sensing of Fluctuating Nanoscale Magnetic Fields Using Nitrogen-Vacancy Centers in Diamond," Physical Review Letters, Nov. 2009.
Hanson, et al., "Coherent Dynamics of a single spin interacting with an adjustable spin bath," Sci. Am. Ass'n for the Advancement of Science, 2008.

(56) References Cited

OTHER PUBLICATIONS

Hanson, et al., "Polarization and Readout of Coupled Single Spins in Diamond," Physical Review Letters, 2006.
Hanson, et al., "Room-temperature manipulation and decoherence of a single spin in diamond," Physical Review, 2006.
Hanzawa, et al., "Zeeman effect on the zero-phonon line of the NV center in synthetic diamond," Physica B, Feb. 1993.
Hegyi & Yablonovitch, "Molecular imaging by optically detected electron spin resonance of nitrogen-vacancies in nanodiamonds," Nano Letters, Mar. 2013.
Hegyi & Yablonovitch, "Nanodiamond molecular imaging with enhanced contrast and expanded field of view," Journal of Biomedical Optics, Jan. 2014.
Hilser, et al., "All-optical control of the spin state in the NV-center in diamond," Physical Review B, Sep. 2012.
Hobbs, "Study of the Environmental and Optical Durability of AR Microstructures in Sapphire, ALON, and Diamond," Proceedings of SPIE, 2009.
Huebener, et al., "ODMR of NV centers in nano-diamonds covered with N©C60," Physica Status Solidi B, Oct. 2008.
Huxter, et al., "Vibrational and electronic dynamics of nitrogen-vacancy centres in diamond revealed by two-dimensional ultrafast spectroscopy," Nature Physics, Nov. 2013.
Ivady, et al., "Pressure and temperature dependence of the zero-field splitting in the ground state of NV centers in diamond: A first-principles study," Physical Review B, Dec. 2014.
Jarmola, et al., "Temperature- and Magnetic-Field-Dependent Longitudinal Spin Relaxation in Nitrogen-Vacancy Ensembles in Diamond," Physical Review Letters, May 2012.
Jensen, et al., "Light narrowing of magnetic resonances in ensembles of nitrogen-vacancy centers in diamond," Physical Review, Jan. 2013.
Kailath, "Linear Systems," Prentice Hall, 1979.
Karlsson, et al., "Diamond micro-optics: microlenses and antireflection structures surfaces for the infrared spectral region," Optics Express, 2003.
Khan & Hemmer, "Noise limitation in nano-scale imaging," Proceedings of SPIE, Dec. 2005.
Kim, et al., "Electron spin resonance shift and linewidth broadening of nitrogen-vacancy centers in diamond as a function of electron irradiation dose," Applied Physics Letters, Aug. 2012.
Kim, et al., "Magnetospectroscopy of acceptors in 'blue' diamonds," Physica B, Aug. 2001.
Kim, et al., "Zeeman effect of electronic Raman lines of accepters in elemental semiconductors: Boron in blue diamond," Physical Review B, Sep. 2000.
King, et al., "Optical polarization of 13C nuclei in diamond through nitrogen vacancy centers," Physical Review B, Feb. 2010.
Kok, et al., "Materials Science: Qubits in the pink," Nature, 2006.
Konenko, et al., "Formation of antireflective surface structures on diamond films by laser patterning," Applied Physics A, 1999.
Kraus, et al., "Magnetic field and temperature sensing with atomic-scale spin defects in silicon carbide," Scientific Reports, Jul. 2014.
Lai, et al., "Influence of a static magnetic field on the photoluminescence of an ensemble of nitrogen-vacancy color centers in a diamond single-crystal," Applied Physics Letters, Sep. 2009.
Lai, et al., "Optically detected magnetic resonance of a single Nitrogen-Vacancy electronic spin in diamond nanocrystals," CLEO/EQEC, 2009.
Laraoui, et al., "Nitrogen—vacancy—assisted magnetometry of paramagnetic centers in an individual diamond nanocrystal," Nano Letters, Jul. 2012.
Lazariev, et al., "A nitrogen-vacancy spin based molecular structure microscope using multiplexed projection reconstruction," Scientific Reports, Sep. 2015.
Lee, et al., "Vector magnetometry based on S=3/2 electronic spins," Physical Review B, Sep. 2015.
Lesik, et al., "Preferential orientation of NV defects in CVD diamond films grown on (113)-oriented substrates," Diamond and Related Materials, Jun. 2015.
Levchenko, et al., "Inhomogeneous broadening of optically detected magnetic resonance of the ensembles of nitrogen-vacancy centers in diamond by interstitial carbon atoms," Applied Physics Letters, Mar. 2015.
Liu, et al., "Electron spin studies of nitrogen vacancy centers in nanodiamonds," Acta Physica Sinica, Aug. 2013.
Liu, et al., "Fiber-integrated diamond-based magnetometer," Applied Physics Letters, Sep. 2013.
MacLaurin, et al., "Nanoscale magnetometry through quantum control of nitrogen-vacancy centres in rotationally diffusing nanodiamonds," New Journal of Physics, Jan. 2013.
Macs, et al., "Diamond as a magnetic field calibration probe," Journal of Physics D: Applied Physics, Apr. 2004.
Maletinsky, et al., "A robust scanning diamond sensor for nanoscale imaging with single nitrogen-vacancy centres," Nature Nanotechnology, May 2012.
Mamin, et al., "Multipulse Double-Quantum Magnetometry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Massachusetts Institute of Technology; "Wide-Field Imaging Using Nitrogen Vacancies" in Patent Application Approval Process, Physics Week (2015).
Matsuda, et al., "Development of a plastic diamond anvil cell for high pressure magneto-photoluminescence in pulsed high magnetic fields," International Journal of Modern Physics B, Nov. 2004.
Maze et al., "Nanoscale magnetic sensing with an individual electronic spin in diamond," Nature Physics (2008).
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.
Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.
Mrozek, et al., "Circularly polarized microwaves for magnetic resonance study in the GHz range: Application to nitrogen-vacancy in diamonds," Applied Physics Letters, Jul. 2015.
Nagl, et al., "Improving surface and defect center chemistry of fluorescent nanodiamonds for imaging purposes-a review," Analytical and Bioanalaytical Chemistry, Oct. 2015.
Neumann, et al., "Excited-state spectroscopy of single NV defects in diamond using optically detected magnetic resonance," New Journal of Physics, Jan. 2009.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H—(172) diamond cluster hosting nitrogen-vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.

(56) References Cited

OTHER PUBLICATIONS

Plakhotnik, et al., "Super-Paramagnetic Particles Chemically Bound to Luminescent Diamond: Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(-)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.
Steinert et al., "High-sensitivity magnetic imaging using an array of spins in diamond," Rev. Sci. Inst. (2010).
Steinert, et al., "High sensitivity magnetic imaging using an array of spins in diamond," Review of Scientific Instruments, Apr. 2010.
Stepanov, et al., "High-frequency and high-field optically detected magnetic resonance of nitrogen-vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.

Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.

\* cited by examiner

ENERGY EFFICIENT CONTROLLED MAGNETIC FIELD GENERATOR CIRCUIT

CROSS-REFERENCE TO RELATED APPLICATIONS

This application claims the benefit of priority under 35 U.S.C. §119 from U.S. Provisional Patent Application No. 61/975,997, filed Apr. 7, 2014, which is incorporated herein by reference in its entirety.

FIELD OF THE INVENTION

The present invention generally relates to signal generators, more particularly, to an energy efficient controlled magnetic field generator circuit.

BACKGROUND

As radio-frequency (RF) and optical electromagnetic signals do not propagate well under the ocean surface or through land, alternative communication methods are to be used for these environments. There are multiple alternative options, each having advantages and disadvantages. Therefore, different approaches may be taken depending on applications. For example, some applications may use a tether to communicate by wire or optical fiber, which can impose maneuvering limits or hazards involving physical contact with vehicles or structures. As another example, acoustic communications are often used, but are affected by multi-path and shallow-water resonances, with the consequence that robust acoustic communications have a very low bit rate. Yet, another candidate can be near-field magnetic communications, which works with low-frequency signals, to be measurable at longer ranges thereby limiting bit rate, and signals which have a rapid drop off in signal strength at longer ranges.

Recent undersea systems research has shown that manipulating the shape of the magnetic field changes over time can provide more information, either for higher bit-rate communications or for difficult-to-counter short-term magnetic pings. This is a departure from traditional magnetic field signal shapes, which are sinusoidal and involve a number of cycles because LC circuit techniques can be used to efficiently vary the magnetic field through a resonance of the LC circuit. Achieving similar energy efficiency in a magnetic field drive circuit and allowing the shape of each cycle of the waveform to be controlled, for example, amplitude modulated, are desired.

SUMMARY

In some aspects, a magnetic waveform generator circuit includes a first switch coupled to a first rectifier element at a first node, a first capacitor coupled, at a second node to the first switch, and to a fourth node, a second capacitor coupled, at a third node to the first rectifier element, and to the fourth node, and an inductor coupled between the first and the fourth nodes. The first switch is operable to be in an ON state during a first time period and in an off state during a second time period. The first switch and the first rectifier element are configured to enable the inductor to generate, during the first and the second time periods, a magnetic field having a waveform resembling a positive half-cycle of a triangular waveform.

In another aspect, a method for providing a magnetic waveform generator includes coupling, at a first node, a first switch to a first rectifier element. A first capacitor may be coupled, at a second node to the first switch, and to a fourth node. A second capacitor may be coupled, at a third node to the first rectifier element, and to the fourth node. An inductor may be coupled between the first and the fourth nodes. The first switch is operable to be in an ON state during a first time period and in an off state during a second time period. The first switch and the first rectifier element are configured to enable the inductor to generate, during the first and the second time periods, a magnetic field having a waveform resembling a positive half-cycle of a triangular waveform.

In yet another aspect, A magnetic waveform generator circuit includes a first switch coupled to a first rectifier element at a first node, a second switch coupled to a second rectifier element at a second node, and a first capacitor coupled, at a third node to the first switch, and to a fifth node. The magnetic waveform generator circuit further includes a second capacitor coupled, at a fourth node to the second switch, and to the fifth node, and an inductor coupled between the first and the second nodes. The first switch and the second switch are operable to be in an ON state during a first time period and in an off state during a second time period. The first switch, the second switch, the first rectifier element, and the second rectifier element are configured to enable the inductor to generate, during the first and the second time periods, a magnetic field having a waveform resembling a positive half-cycle of a triangular waveform.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1B:
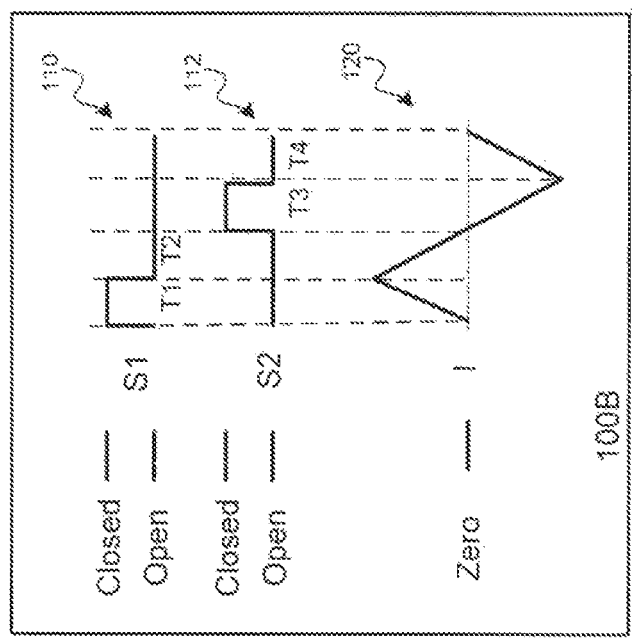
FIGS. 1A through 1F are diagrams illustrating examples of a magnetic waveform generator circuit, a corresponding timing diagram, and various operational phases of the magnetic waveform generator circuit, according to certain embodiments.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The present disclosure is directed, in part, to an energy efficient controlled magnetic field generator circuit. The subject technology uses a coil electromagnet to establish a variable magnetic field that reaches out a significant distance. This subject solution transfers energy between energy storage devices (e.g., inductors and capacitors) using a switching scheme that enables the control of the ramp rate and duration of each cycle of the magnetic field waveform. The ramp rate is the rate of change of the magnetic field, and by varying the ramp rate, among other things, a triangle wave of selectable amplitude, can be created. The subject technology provides a family of circuits that can accomplish the energy transfer with substantially low energy consumption. Ideally, the disclosed circuits use no energy if lossless devices such as switches, capacitors, and inductors were used. In practice, no device is perfectly lossless, an the circuits do draw energy. However, the energy consumption of the disclosed circuits is substantially low compared to the generated magnetic field strength.

Traditionally, an efficient approach to generate a magnetic field is using a series LC resonators circuit that generates a sinusoidal waveform. There are techniques for varying the average amplitude and/or frequency of the resonance. These techniques are not single-cycle control techniques. It is understood that resonant LC circuits that work with many cycles of the waveform to deliver information have a lower rate of information delivery. By being able to modulate each cycle of the waveform, more bits per second can be delivered. In addition, by achieving the control through ramp rate control, the waveform can have a triangle shape which can have higher amplitude, and more importantly, a higher L2-norm than a sine wave with the same peak slope. The peak slope corresponds to the maximum voltage that the circuit can tolerate. The triangular waveform can achieve a higher signal-to-noise ratio (SNR) for a given maximum voltage in the drive circuit. For sensing applications (e.g., magnetic ping), single cycle control can perform identification with a shorter signal duration, requiring higher sophistication and cost on the part of the adversary to cancel, and also allowing a shorter duty cycle and thus more stealth and energy efficiency.

FIGS. 1A through 1F are diagrams illustrating examples of a magnetic waveform generator circuit 100A, a corresponding timing diagram 100B, and various operational phases 100C through 100F of the magnetic waveform generator circuit, according to certain embodiments. The magnetic waveform generator circuit 100A (hereinafter "circuit 100A") includes a first switch S1 coupled between a first node 102 (hereinafter "node102") and a second node 104 (hereinafter "node104"), a second switch S2 coupled between node 102 and a third node 106 (hereinafter "node106"), a first rectifier element D1 coupled in parallel to the switch S2, and a second rectifier element D2 coupled in parallel to the switch S1. The circuit 100A further includes an inductor coupled between node 102 and a fourth node 108 (hereinafter "node108"), a first capacitors C1 coupled between nodes 104 and 108, and a second capacitors C2 coupled between nodes 108 and 106. Node 108 is coupled to ground potential and capacitors C1 and C2 are precharged to +Vp (e.g., 100V) and −Vp (e.g., −100V).

In one or more implementations, the switches S1 and S2 can be implemented with semiconductor switches such as transistors (e.g., bipolar junction transistor (BIT), field-effect transistor (FET)) or other types of switches). The rectifier elements D1 and D2 can be semiconductor diodes (e.g., silicon diodes) or other rectifier elements. The inductor L is a magnetic coil of the magnetic waveform generator and can have an inductance value of the order of hundreds of micro-Henry (µH), for example, 300 µH, and capacitance values of the capacitors C1 and C2 can be of the order of hundreds of micro-farad (µF). The circuit 100A can generate a current i in the in inductor L that has an optimized waveform, for example, a triangular waveform, by controlling the switches S1 and S2, as shown in the timing diagram 100B of FIG. 1B.

Figure 1A:
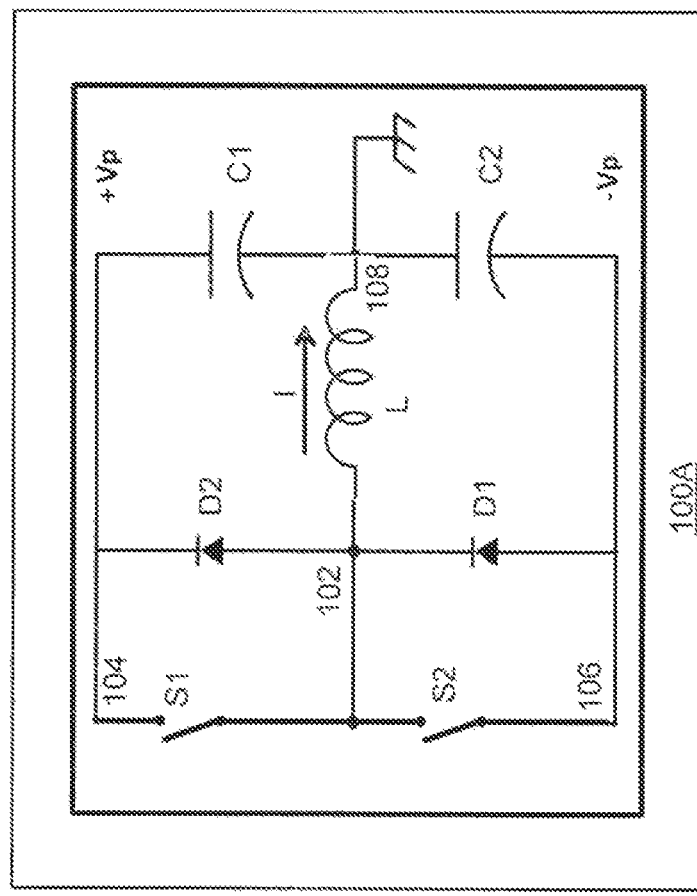

The timing diagram 100B includes control pulses 110 and 112 applied to the switches S1 and S2, and a triangular waveform 120 for the current i of the inductor L of FIG. 1A. During a time period T1, switch S1 is closed and switch S2 is open. During a time period T2, both switches S1 and S2 are open, and during a time period T3, switch S1 is open and switch S2 is closed, and during a time period T4, both switches S1 and S2 are open again. The four phases of switches S1 and S2 can cause the current i of the inductor L run through the ramp-up and ramp-down cycles to create a full cycle of the triangular waveform 120. More detailed operational descriptions of the circuit 100A are provided below with respect to FIGS. 1C through 1F.

Figure 1C:
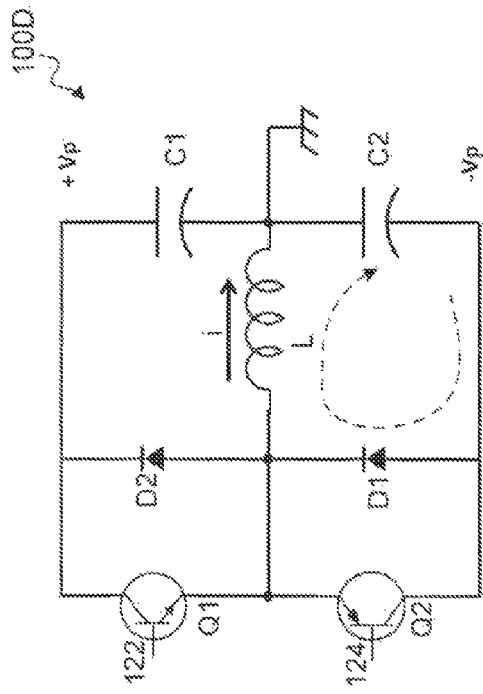

The operational phase 100C shown in FIG. 1C depicts the operation of the circuit 100A of FIG. 1A during the time period T1 of FIG. 1B. Transistors Q1 (e.g., an NPN transistor) and Q2 (e.g., a PNP transistor) are example implementations of the switches S1 and S2 of FIG. 1A. During the operational phase 100C, the transistor Q1 is on and the transistor Q2 is off, and diodes D1 and D2 are both reverse biased by the initial voltage (e.g., 100V) of the capacitors C1 and C2. The capacitor C1 discharges through the transistor Q1 and the inductor L, thereby passing a positive up-ramping (increasing) current i in the inductor L, which forms the first quarter cycle, corresponding to the time period T1, of the triangular waveform 120 of FIG. 1B. In practice, the current i ramps up in a manner which can be closely approximated with a linear ramp when the capacitor sizing and switch closure interval are such that the capacitor voltage remains nearly constant during discharging or recharging intervals.

Figure 1D:
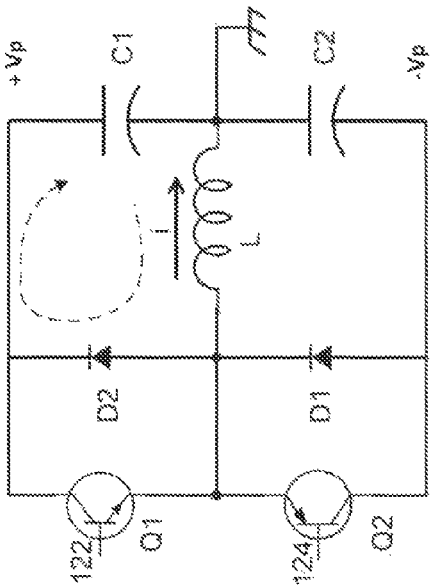

The operational phase 100D shown in FIG. 1D depicts the operation of the circuit 100A of FIG. 1A during the time period T2 of FIG. 1B. During the operational phase 100D, both transistors Q1 and Q2 and diode D2 are off. The stored energy in the inductor L during the phase 100C, is delivered to capacitor C2 and charges this capacitor through the diode D1 and the inductor L, thereby passing a positive down-ramping (decreasing) current i in the inductor L, which forms the second quarter cycle, corresponding to the time period T2, of the triangular waveform 120 of FIG. 1B.

Figure 1E:
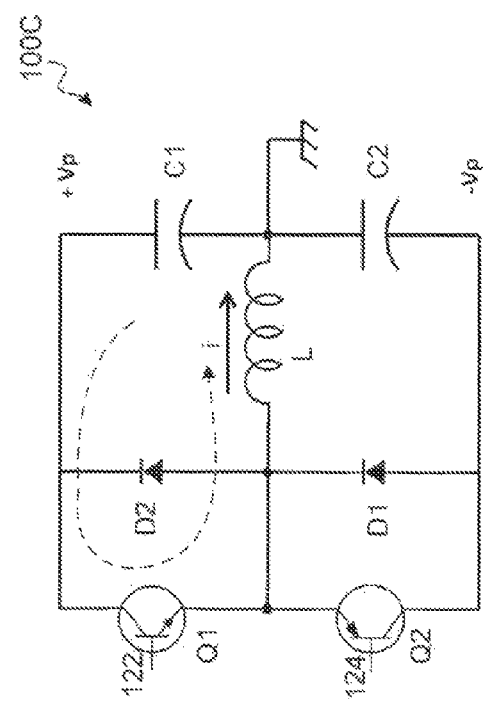

The operational phase 100E shown in FIG. 1E depicts the operation of the circuit 100A of FIG. 1A during the time period T3 of FIG. 1B. During the operational phase 100E, the transistors Q2 is on and the transistor Q1 and both diodes D1 and D2 are off. During this phase, capacitor C2 discharges through the transistor Q2 and the inductor L and induces a negative increasing current in the inductor L, which continues the down-ramping leg of the triangular waveform 120 until the end of period T3.

Figure 1F:
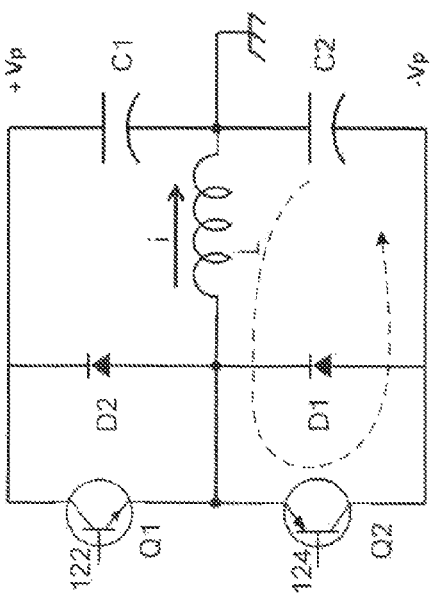

The operational phase 100F shown in FIG. 1F depicts the operation of the circuit 100A of FIG. 1A during the time period T4 of FIG. 1B. During the operational phase 100F, both transistors Q1 and Q2 and diode D1 are off, and the capacitor C1 is charged through diode D2 and the inductor L. The current i of the inductor L is negative and decreasing and reaches zero as the capacitor C1 is charged nearly to its initial voltage. In the circuits 100A and 100C through 100F, the drive circuitry, protection circuitry, power supplies, and internal resistors (e.g., for the inductor L) are not shown for simplicity. With ideal lossless circuit elements, at the completion of the four switching periods (T1 through T4), the capacitors would have exactly the same voltage as they had at the beginning of the four periods. However, because of internal resistors and non-ideal switches and rectifiers, there is some energy loss, with the result that the capacitors do not have exactly their original voltage after the sequence of four switching periods. To compensate for this energy loss, some means of recharging (e.g., a trickle charge or a rapid charge with the inductor disengaged) the capacitors can be employed to prevent any operation failure due to the non-idealities. The effect of this deviation from the ideal straight line in the triangular waveform may be compensated tier by using, in the receiver, a demodulator that is matched with the non-ideal waveform.

Figure 2A:
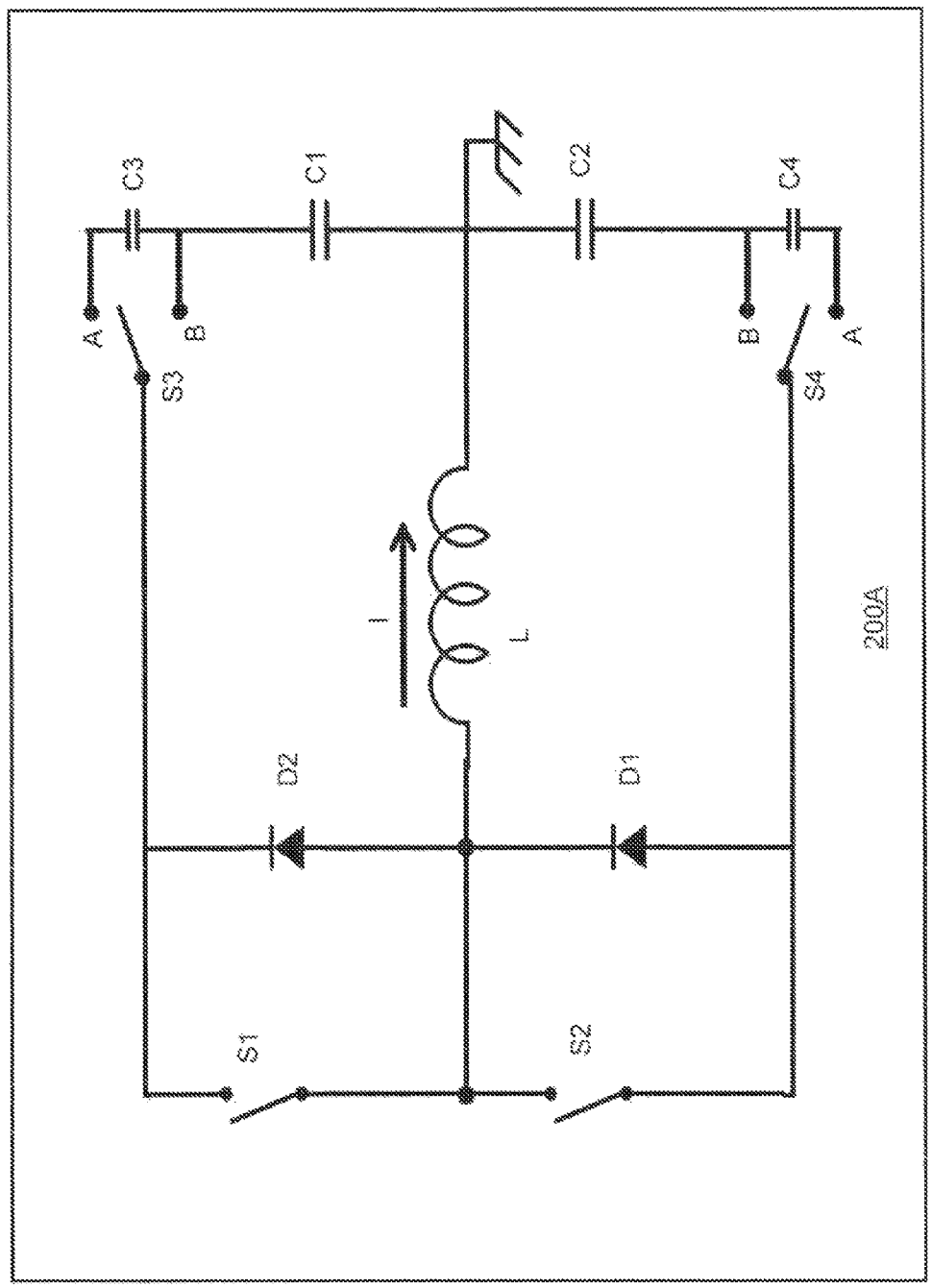
FIGS. 2A-2B are diagrams illustrating examples of a magnetic waveform generator circuit with amplitude modulation capability and corresponding timing diagrams, according to certain embodiments.
Figure 2B:
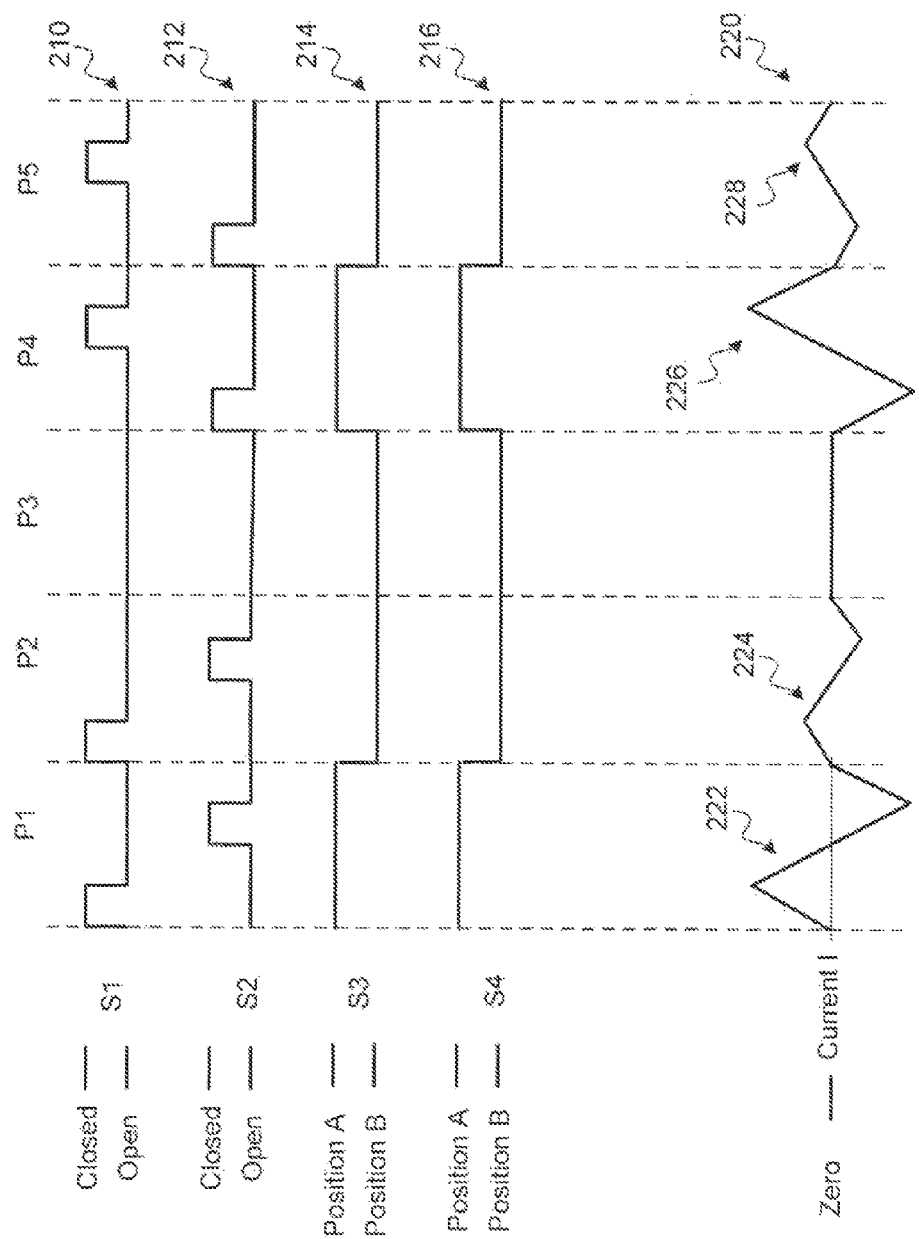

FIGS. 2A-2B are diagrams illustrating examples of a magnetic waveform generator circuit 200A with amplitude modulation capability and corresponding timing diagrams 210, 212, 214, 216, and 220, according to certain embodiments. The magnetic waveform generator circuit 200A is similar to the circuit 100A of FIG. 1A, except for the additional switches S3 and S4 and capacitors C3 and C4. The addition of the switches S3 and S4 and capacitors C3 and C4 enable circuit 200A to generate a current i in the inductor L with a triangular waveform that can be amplitude modulated. The switches S3 and S4 are dipole switches that can be set to be connecting at either of two positions A or B. When set to be at position A, the switches S3 and S4, allow the capacitors C3 and C4 to be connected in series with the capacitors C1 and C2, respectively. When switches S3 and S4 are set to be connecting at position B, the circuit 200 becomes similar and operates similarly to the circuit 100A. The switches S3 and S4 can be implemented as semiconductor dipole switches using known transistor or diode switch circuitry.

When the switches S3 and S4 are set to be connecting at position A, as mentioned above, capacitors C3 and C4 are connected in series with capacitors C1 and C2 to provide a higher voltage for driving the current i through the inductor L, which can form the high current amplitude of the amplitude modulated waveform, as shown in the timing diagram 220 of FIG. 2B. In the circuit 200A, the drive circuitry, protection circuitry, power supplies, and internal resistors (e.g., for the inductor L) are not shown for simplicity The timing diagrams 210, 212, 214, 216 shown in FIG. 2B are control pulses applied to switches S1 through S4. The timing diagrams are shown for five consecutive cycles (e.g., periods) P1 P2 . . . P5. During the first cycle P1, switches S1 and S2 are toggled as explained with respect to phases 100C through 100F of FIGS. 1C through 1F, and the switches S3 and S4 are set at position A, to allow capacitors C3 and C4 be connected in series with the capacitors C1 and C2, thereby providing the high amplitude triangular waveform, as shown by waveform 222. The amplitude of the triangular waveform may be reduced by removing the capacitors C3 and C4 from the circuit 200A, thereby providing smaller voltage to drive the inductor current through the inductor L. This is done at cycle P2, where the switches S3 and S4 are both set to position B and switches S1 and S2 go through the phases to generate a triangular waveform as explained above. The ratio of amplitudes of the waveforms 222 and 224 depend on the capacitance values of the capacitors C1, C2, C3, and C4. For example, if the capacitance values of the capacitors C1, C2, C3, and C4 are the same, the amplitude of the waveform 224 would be half of the amplitude of the waveform 222. Other amplitude ratios can be achieved by suitably selecting the capacitance values of the capacitors C1, C2, C3, and C4.

During the third cycle P3, switches S1 and S2 are open and switches S3 and S4 are set at position 8, and the charged capacitors C1 have no path for driving current into the inductor L. Therefore, during cycle −P3, zero current passes through the inductor L. During this cycle, a recharge circuit (not shown for simplicity) can return the voltages of capacitors C1 and C2 to their desired level, correcting for resistive losses, without generating a current in the inductor and therefore without affecting the magnetic field. During the cycles P4 and P5, the setting of switches S3 and S4 are the same as cycles P1 and P2, but the status of switches S1 and S2 in cycles P4 and P5 are reversed relative to cycles P1 and P2, respectively. As a consequence, the direction of currents in the inductor L are also reversed, resulting in waveforms 226 and 228, which have the same amplitudes as their respective waveforms 222 and 224, but with opposite polarities.

The waveforms 222, 224, 226, and 228 can be used to represent, for example, binary symbols 11, 10, 01, and 00 by a magnetic communications transmitter using the circuit 200A as the magnetic field generator. The cycle P3, which has no signal, can be used as the OFF symbol to allow for calibration, synchronization, and background cancellation in the receiver side.

Figure 3A:
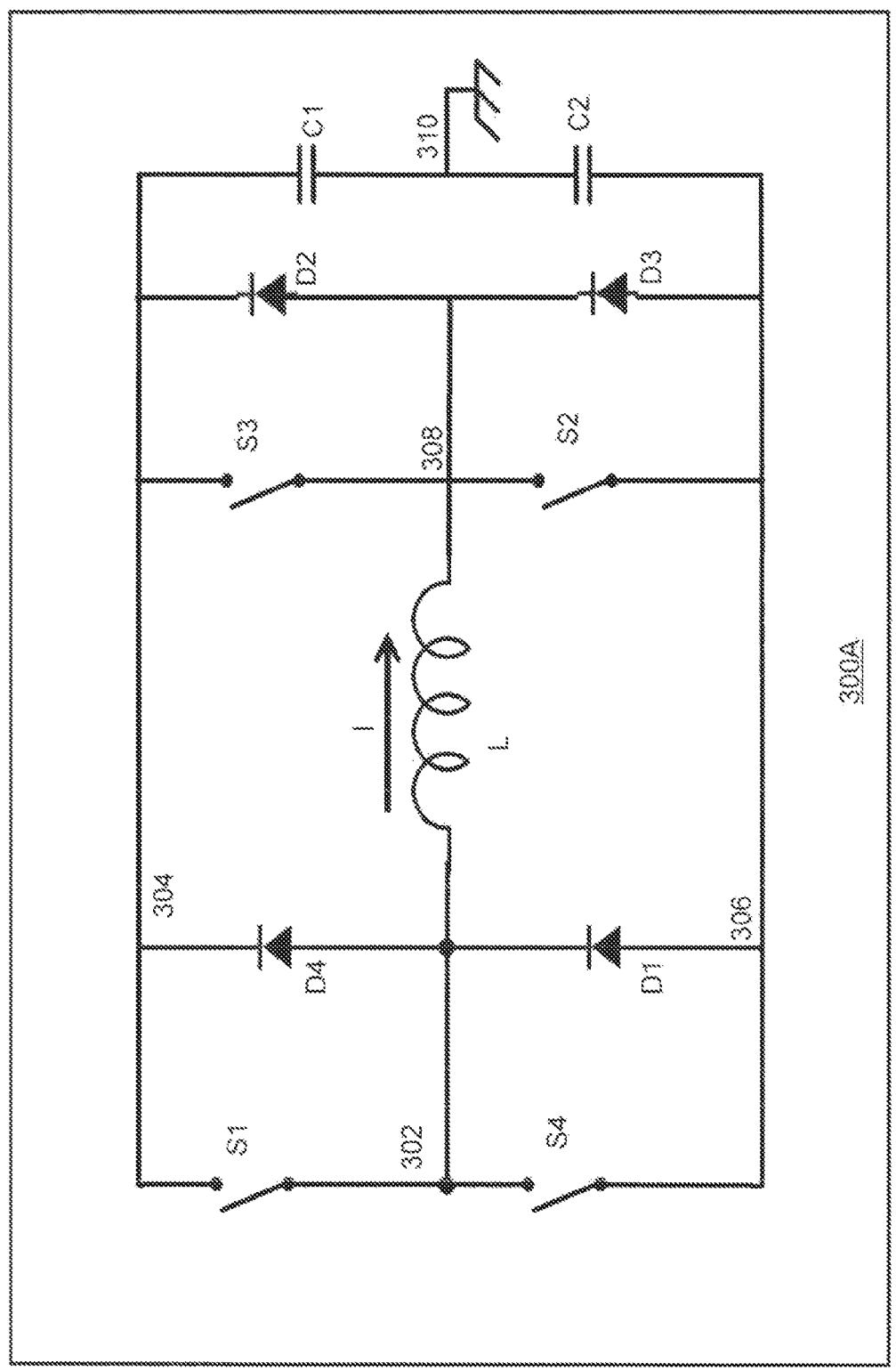
FIGS. 3A-3B are diagrams illustrating examples of an H-bridge magnetic waveform generator circuit and an H-bridge magnetic waveform generator circuit with amplitude modulation capability, according to certain embodiments.
Figure 3B:
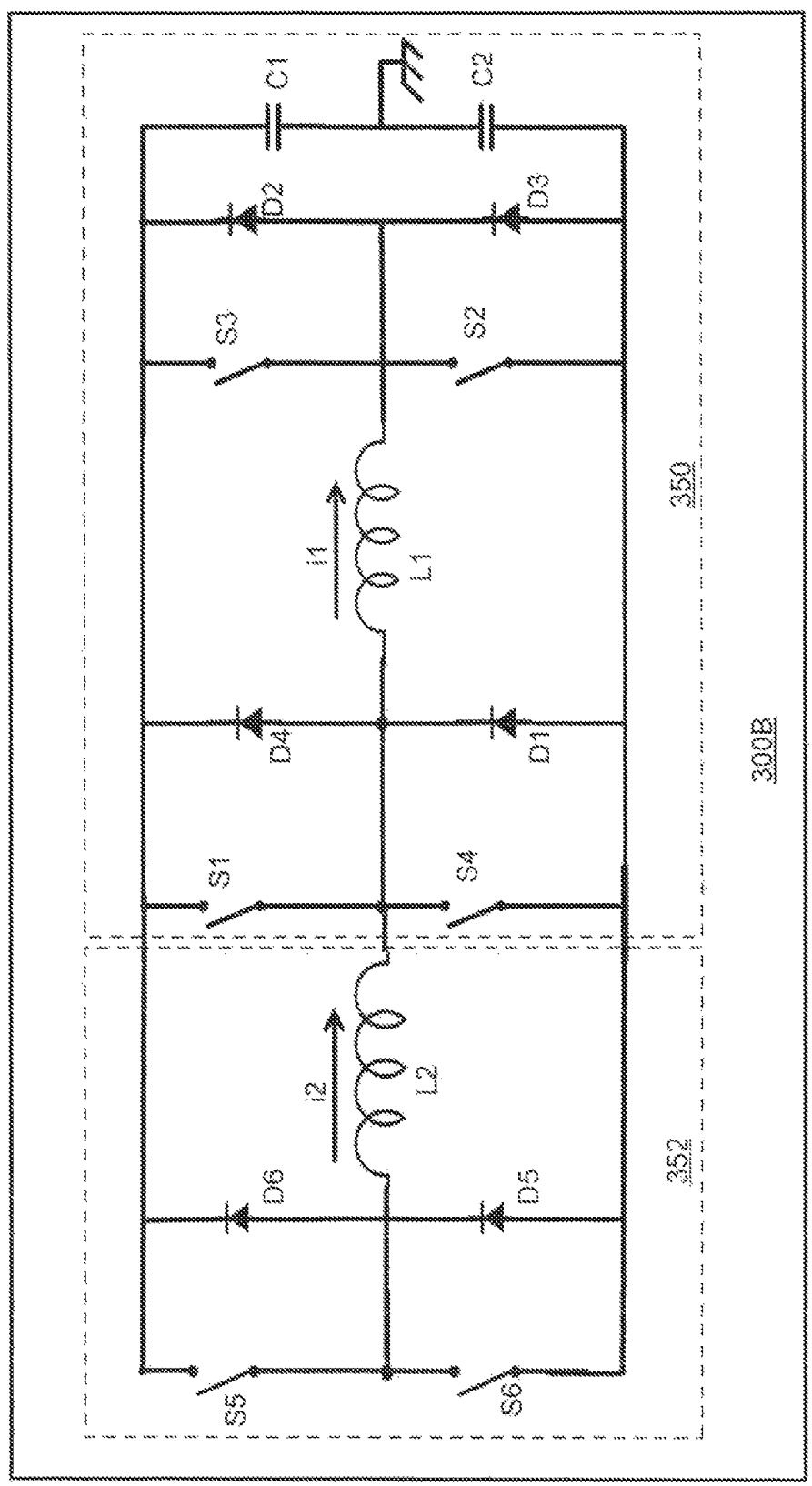

FIGS. 3A-3B are diagrams illustrating examples of an H-bridge magnetic waveform generator circuit 300A and an H-bridge magnetic waveform generator circuit 300B with amplitude modulation capability, according to certain embodiments. The bridge magnetic waveform generator circuit 300A (hereinafter "circuit 300A") is similar to circuit 100A of FIG. 1A, except for the additional switches S3 and S2 and diodes D2 and D3 and the fact that node 308 of the inductor L is not connected to the ground potential. The switch S3 is coupled between nodes 304 and 308, and switch S2 is coupled between nodes 308 and 306. Diodes D2 and D3 are coupled in parallel with switches S3 and S2, respectively. The capacitors C1 and C2 join at node 310 that is coupled to ground potential. In the circuit 300A, the drive circuitry, protection circuitry, power supplies, and internal resistors (e.g., for the inductor L) are not shown for simplicity. Switches S2 and S3 and diodes D2 and D3 can be implemented in the same semiconductor chip using transistor switches and semiconductor (e.g., silicon) diodes.

The configuration of FIG. 300A has the advantageous feature that allows using lower supply voltage values. For example, the capacitors C1 and C2 can each be precharged to 50V (instead of 100V for circuit 100A) and the circuit 300A still provides the same amplitude triangular waveform for the current in the inductor L. The operation of the circuit 300A includes four phases, during which status of switches S1, S2, S3, and S4 are controlled to be different to allow suitable paths for flow of current from or to the capacitors C1 and C2 through the inductor L.

During a first phase, switches S1 and S2 are closed and switches S3 and S4 are open, and diodes D1 and D2 are reverse biased. During the first phase, the capacitors C1 and C2 discharge to drive a positive increasing (up-ramping) current through the switches S1 and S2 and the inductor L.

This current provides the first quarter-cycle of a triangular current waveform (e.g., 120 of FIG. 1B). During a second phase, switches S1, S2, S3, and S4 are open, and diodes D1 and D2 are forward biased and conduct current. During this phase, the capacitors C1 and C2 recharge, which causes driving a positive decreasing (down-ramping) current through the diodes D1 and D2 into the inductor L. This current provides the second quarter-cycle of the triangular current waveform.

During a third phase, switches S3 and S4 are closed and switches S1 and S2 are open, and diodes D1 and D2 are reverse biased. During this phase, the capacitors C1 and C2 discharge to drive a negative (e.g., with revered direction) increasing amplitude current through the switches S3 and S4 and the inductor L. This current provides the third quarter-cycle of the triangular current waveform. During a fourth phase, switches S1, S2, S3, and S4 are open, and diodes D3 and D4 are forward biased and conduct current. During this phase, the capacitors C1 and C2 recharge and cause driving a negative decreasing current into the inductor L through diodes D3 and D4. This current provides the fourth quarter-cycle of the triangular current waveform. The circuit 300A can be modified to provide amplitude modulation as discussed herein.

The H-bridge magnetic waveform generator circuit 300B (hereinafter "circuit 300B") shown in FIG. 3B has amplitude modulation capability. The circuit 300B has a portion 350 that is similar to the circuit 300A and an additional portion 352 including an inductor L2, diodes D5 and D6, and switches S5 and S6. Here, the inductor L2 does not create an external magnetic field at long distances as, for example, a toroidal inductor. Whereas the inductor L1 creates an external magnetic waveform as, for example, a magnetic coil. The operation of portion 350 is also similar to the operation of circuit 300A, as discussed above. The portion 350 is used to generate a high (e.g., maximum)-amplitude triangular current waveform (e.g., 222 of FIG. 2B), during the four phased as discussed above with respect to FIG. 3A. During these phases switches S5 and S6 are open. When generating a low-amplitude triangular current waveform (e.g., 224 of FIG. 2B), the portion 352 comes into the play and switches S5 and S6 are suitably opened or closed (while S1 and S4 are kept open) to allow driving currents in two different directions, as explained above, into series connected inductors L1 and L2. The series connection of inductors L1 and L2 increases the impedance in the path of the current and thereby decrease the amplitude of the current passing through the inductors L1 and L2. The ratio of amplitudes of the low-amplitude and high-amplitude waveforms depend on the inductance values of the inductors L1 and L2. For example, if the inductance values of the inductors L1 and L2 are the same, the amplitude of the low-amplitude waveform would be half of the amplitude of the high-amplitude waveform. Other amplitude ratios can be achieved by suitably selecting the inductance values of the inductors L1 and L2.

Figure 4:
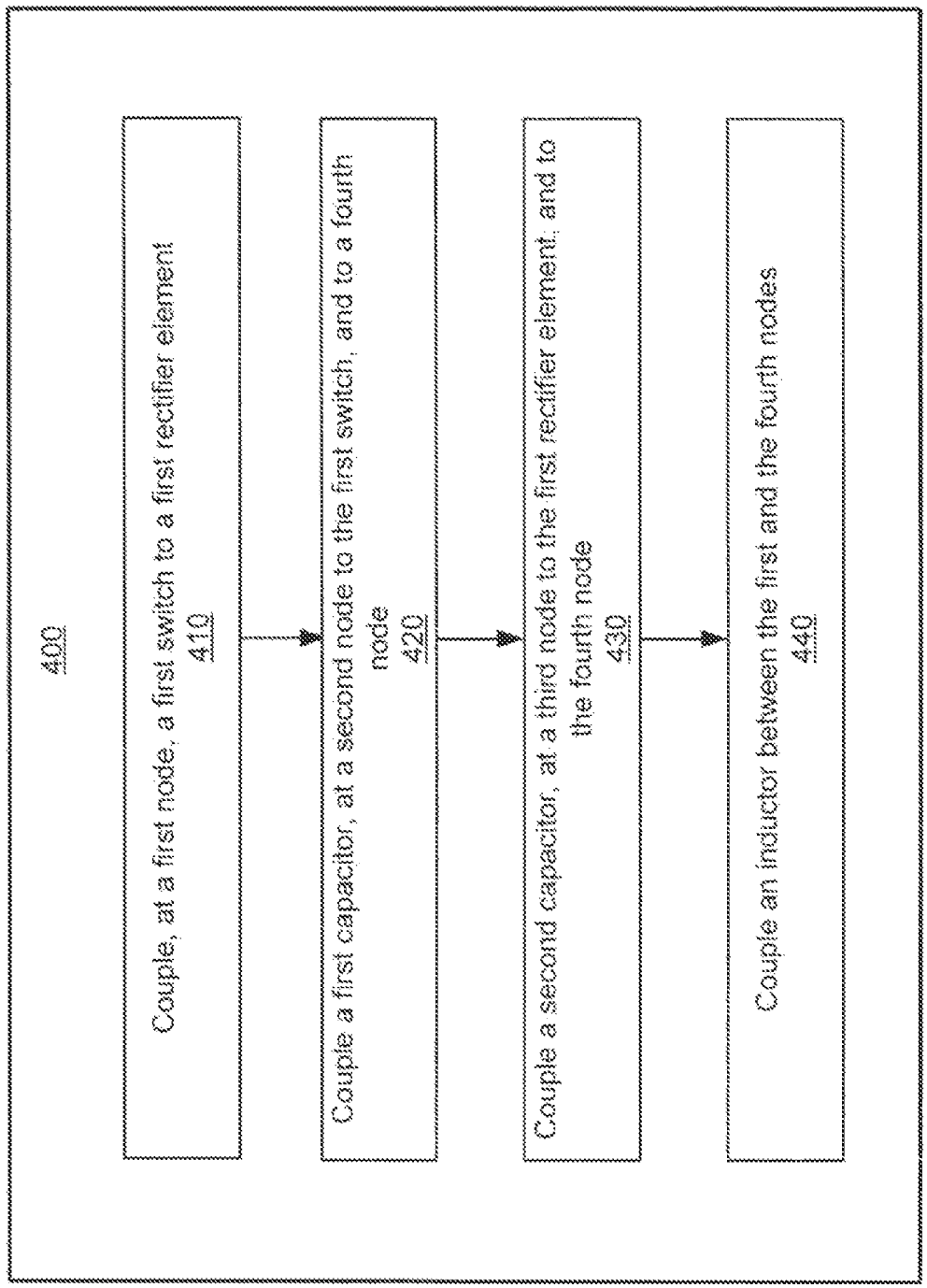
FIG. 4 is a diagram illustrating an example of a method for providing a magnetic waveform generator circuit, according to certain embodiments.

FIG. 4 is a diagram illustrating an example of a method 400 for providing a magnetic waveform generator circuit, according to certain embodiments. According to the method 400, a first switch (e.g., S1 of FIG. 1A) is coupled, at a first node (e.g., 102 of FIG. 1A), to a first rectifier element (e.g., D1 of FIG. 1A) (410). A first capacitor (e.g., C1 of FIG. 1A) is coupled, at a second node (e.g., 104 of FIG. 1A) to the first switch, and to a fourth node (e.g., 108 of FIG. 1A) (420). A second capacitor may be coupled, at a third node (e.g., 106 of FIG. 1A) to the first rectifier element, and to the forth node (430). An inductor (e.g., L of FIG. 1A) may be coupled between the first and the fourth nodes (440). The first switch is operable to be in an ON state during a first time period (e.g., T1 of FIG. 1B) and in an off state during a second time period (e.g., T2 of FIG. 1B). The first switch and the first rectifier element are configured to enable the inductor to generate, during the first and the second time periods, a magnetic field having a waveform resembling a positive half-cycle of a triangular waveform (e.g., 120 of FIG. 1B).

Although the invention has been described with reference to the disclosed embodiments, one having ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is the following:

1. A magnetic waveform generator circuit, the circuit comprising:
   a first switch coupled to a first rectifier element at a first node;
   a first capacitor coupled, at a second node to the first switch, and to a fourth node;
   a second capacitor coupled, at a third node to the first rectifier element, and to the fourth node;
   an inductor coupled between the first and the fourth nodes;
   a second switch coupled to a second rectifier element at the first node, wherein the first switch is coupled in parallel to the second diode and the second switch is coupled in parallel to the first diode; and
   a first and a second dipole switch and a third and fourth capacitor,
   wherein:
   the first switch is operable to be in an ON state during a first time period and in an off state during a second time period,
   the first switch and the first rectifier element are configured to enable the inductor to generate, during the first and the second time periods, a magnetic field having a waveform resembling a positive half-cycle of a triangular waveform,
   the second switch and the second rectifier element are configured to enable the inductor to generate, during a third and a fourth time periods, a magnetic field having a waveform resembling a negative half-cycle of the triangular waveform, the first dipole switch is operable, in a first state, to couple the second node through the third capacitor to the first capacitor, and the second dipole switch is operable, in a first state, to couple the third node through the fourth capacitor to the second capacitor to allow generation of a high amplitude triangular magnetic field waveform.

2. The circuit of claim 1, wherein the first switch is configured to allow the first capacitor to discharge through the inductor in the first time period and the rectifier element is configured to allow the second capacitor to charge through the inductor in the second time period.

3. The circuit of claim 1, wherein the second switch is operable to be in an ON state during the third time period to allow the second capacitor to discharge through the inductor in the third time period, wherein the second rectifier element is configured to allow the first capacitor to charge through the inductor in the fourth time period, wherein the first and second switches comprise transistor switches and the rectifier elements comprise diodes, and wherein the first and second switches comprise semiconductor switches and the rectifier elements comprise semiconductor diodes.

4. The circuit of claim 1, wherein the first dipole switch and the second dipole switch are operable, in second states, to isolate the third and fourth capacitors to allow a low amplitude triangular magnetic field waveform, and wherein the low amplitude triangular magnetic field waveform has an amplitude that is one-third of the high amplitude triangular magnetic field waveform.

5. A method for providing a magnetic waveform generator, the method comprising:

coupling, at a first node, a first switch to a first rectifier element;

coupling a first capacitor, at a second node to the first switch, and to a fourth node;

coupling a second capacitor, at a third node to the first rectifier element, and to the fourth node;

coupling an inductor coupled the first and the fourth nodes;

coupling a second switch to a second rectifier element at the first node, and coupling the first switch in parallel to the second diode and the second switch in parallel to the first diode; and providing a first and a second dipole switch and a third and a fourth capacitor, wherein:

the first switch is operable to be in an ON state during a first time period and in an off state during a second time period, the first switch and the first rectifier element are configured to enable the inductor to generate, during the first and the second time periods, a magnetic field having a waveform resembling a positive half-cycle of a triangular waveform, configuring the second switch and the second rectifier element to enable the inductor to generate, during a third and a fourth time periods, a magnetic field having a waveform resembling a negative half-cycle of the triangular waveform, configuring the first dipole switch to be operable, in a first state, to couple the second node through the third capacitor to the first capacitor, and configuring the second dipole switch to be operable, in a first state, to couple the third node through the fourth capacitor to the second capacitor to allow generation of a high amplitude triangular magnetic field waveform.

6. The method of claim 5, further comprising configuring the first switch to allow the first capacitor to discharge through the inductor in the first time period and configuring the rectifier element to allow the second capacitor to charge through the inductor in the second time period.

7. The method of claim 5, further comprising configuring the second switch to be operable to be in an ON state during the third time period to allow the second capacitor to discharge through the inductor in the third time period, and configuring the second rectifier element to allow the first capacitor to charge through the inductor in the fourth time period.

8. The method of claim 5, further comprising configuring the first dipole switch and the second dipole switch to be operable, in second states, to isolate the third and fourth capacitors to allow a low amplitude triangular magnetic field waveform, and wherein the low amplitude triangular magnetic field waveform has an amplitude that is one-third of the high amplitude triangular magnetic field waveform.

9. A magnetic waveform generator circuit, the circuit comprising:

a first switch coupled to a first rectifier element at a first node;

a second switch coupled to a second rectifier element at a second node a first capacitor coupled, at a third node to the first switch, and to a fifth node;

a second capacitor coupled, at a fourth node to the second switch, and to the fifth node; and an inductor coupled between the first and the second nodes, wherein:

the first switch and the second switch are operable to be in an ON state during a first time period and in an off state during a second time period, and the first switch, the second switch, the first rectifier element, and the second rectifier element are configured to enable the inductor to generate, during the first and the second time periods, a magnetic field having a waveform resembling a positive half-cycle of a triangular waveform.

10. The circuit of claim 9, wherein the first switch and the second switch are configured to allow the first capacitor and the second capacitor to discharge through the inductor in the first time period and the first rectifier element and the second rectifier element are configured to allow the first capacitor and the second capacitor to charge through the inductor in the second time period.

11. The circuit of claim 9, further comprising a third switch coupled between the third node and the second node and, a fourth switch coupled between the first node and the fourth node, a third rectifier element coupled in parallel with the second switch, and a fourth rectifier element coupled in parallel to the first switch.

12. The circuit of claim 11, wherein the third switch, the fourth switch, the second rectifier element, and the first rectifier element are configured to enable the inductor to generate, during a third and a fourth time periods, a magnetic field having a waveform resembling a negative half-cycle of the triangular waveform.

13. The circuit of claim 12, wherein the third switch and the fourth switch are operable to be in an ON state during the third time period to allow the first capacitor and the second capacitor to discharge through the inductor in the third time period, wherein the third rectifier element and the fourth rectifier element are configured to allow the first capacitor and the second capacitor to charge through the inductor in the fourth time period, and wherein switches comprise semiconductor switches and rectifier elements comprises semiconductor diodes.

14. The circuit of claim 12, further comprising a fifth switch coupled between the third and a sixth node, a sixth switch coupled between the fourth node and the sixth node, a fifth rectifier element coupled in parallel to the sixth switch, and a sixth rectifier element coupled in parallel to the fifth switch, and a second inductor coupled between the sixth node and the first node, wherein addition of the fifth switch, fifth rectifier element, the sixth switch, and the sixth rectifier element allows generation of amplitude modulated triangular waveform magnetic field.

* * * * *

UNITED STATES PATENT AND TRADEMARK OFFICE
CERTIFICATE OF CORRECTION

| | | |
|---|---|---|
| PATENT NO. | : 9,590,601 B2 | |
| APPLICATION NO. | : 14/680877 | |
| DATED | : March 7, 2017 | |
| INVENTOR(S) | : James Michael Krause, James P. Mabry and Elton Pepa | |

It is certified that error appears in the above-identified patent and that said Letters Patent is hereby corrected as shown below:

In the Claims

In Claim 9, Column 10, Line 27:
Insert --;-- after "second node."

Signed and Sealed this
Sixteenth Day of May, 2017

Michelle K. Lee
*Director of the United States Patent and Trademark Office*